US010855227B2

(12) United States Patent
Takagi

(10) Patent No.: US 10,855,227 B2
(45) Date of Patent: Dec. 1, 2020

(54) DISTORTION COMPENSATION CIRCUIT

(71) Applicant: Murata Manufacturing Co., Ltd., Kyoto (JP)

(72) Inventor: Tsuyoshi Takagi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 10 days.

(21) Appl. No.: 16/254,715

(22) Filed: Jan. 23, 2019

(65) Prior Publication Data

US 2019/0229680 A1 Jul. 25, 2019

(30) Foreign Application Priority Data

Jan. 24, 2018 (JP) .................................. 2018-009770

(51) Int. Cl.
*H03F 3/04* (2006.01)
*H03F 1/02* (2006.01)
*H03F 3/21* (2006.01)
*H03F 3/19* (2006.01)
*H03F 1/32* (2006.01)
*H03F 1/30* (2006.01)

(52) U.S. Cl.
CPC ............ *H03F 1/0211* (2013.01); *H03F 1/32* (2013.01); *H03F 3/19* (2013.01); *H03F 3/21* (2013.01); *H03F 1/302* (2013.01); *H03F 2200/18* (2013.01); *H03F 2200/267* (2013.01); *H03F 2200/451* (2013.01)

(58) Field of Classification Search
CPC . H03F 1/0211; H03F 1/32; H03F 3/21; H03F 3/19; H03F 2200/267; H03F 2200/451; H03F 1/0261; H03F 2200/18; H03F 1/302; H03F 1/301; H03F 3/26; H03F 3/3088; H03G 3/3042; H03G 3/3047
USPC .................................................. 330/285, 296
See application file for complete search history.

(56) References Cited

U.S. PATENT DOCUMENTS 7,154,336 B2 * 12/2006 Maeda .................... H03F 1/302
330/285
7,345,547 B2 * 3/2008 Wang ........................ H03F 1/30
330/285
7,449,957 B2 * 11/2008 Enomoto .................. H03F 1/30
330/295

(Continued)

FOREIGN PATENT DOCUMENTS

JP 4155326 B2 9/2008

*Primary Examiner* — Khanh V Nguyen
(74) *Attorney, Agent, or Firm* — Pearne & Gordon LLP

(57) ABSTRACT

A distortion compensation circuit includes an amplifier circuit, a bias circuit, a wiring, and a capacitive element. The bias circuit applies a bias voltage to the amplifier circuit. The wiring connects the amplifier circuit and the bias circuit. The capacitive element is connected to the wiring to cancel at least part of parasitic inductance produced in the wiring. The amplifier circuit includes an input terminal, an amplifier, a first capacitor, a connection node, and first and second resistors. An input signal is inputted into the input terminal. The amplifier amplifies the input signal. The first capacitor is disposed on a path connecting the input terminal and the amplifier. The connection node is disposed between the bias circuit and the amplifier. The first resistor is disposed on a path connecting the input terminal and the connection node. The second resistor is connected between the amplifier and the connection node.

16 Claims, 4 Drawing Sheets

(56) References Cited

U.S. PATENT DOCUMENTS

| | | | |
|---|---|---|---|
| 9,692,370 B2* | 6/2017 | Chiu | ................... H03F 3/21 |
| 2007/0164824 A1* | 7/2007 | Aoki | ................ H03F 1/0266 |
| | | | 330/285 |
| 2007/0222033 A1 | 9/2007 | Ariie | |
| 2015/0295549 A1* | 10/2015 | Hirooka | ............ H03F 1/0261 |
| | | | 330/296 |

* cited by examiner

DISTORTION COMPENSATION CIRCUIT

This application claims priority from Japanese Patent Application No. 2018-009770 filed on Jan. 24, 2018. The content of this application is incorporated herein by reference in its entirety.

BACKGROUND OF THE DISCLOSURE

1. Field of the Disclosure

The present disclosure relates to a distortion compensation circuit including a bias circuit.

2. Description of the Related Art

A distortion compensation circuit including a bias circuit which applies a bias voltage to an input signal and an amplifier circuit using a transistor is known (see Japanese Patent No. 4155326, for example). In such a distortion compensation circuit, to reduce distortion, a resistor is connected between an input terminal of the distortion compensation circuit and the bias circuit, thereby improving the distortion characteristics of the amplifier circuit.

BRIEF SUMMARY OF THE DISCLOSURE

In the distortion compensation circuit disclosed in the above-described publication, however, if a long wiring is used to connect the input terminal and the bias circuit, parasitic inductance is produced in the wiring and may lessen the effect of reducing the distortion by the resistor. This may lead to the degradation of the distortion characteristics.

Accordingly, it is an object of the present disclosure to provide a distortion compensation circuit which exhibits high distortion characteristics even with the use of a long wiring between a bias circuit and an amplifier circuit.

According to an aspect of the present disclosure, there is provided a distortion compensation circuit including an amplifier circuit, a bias circuit, a wiring, and a capacitive element. The bias circuit applies a bias voltage to the amplifier circuit. The wiring connects the amplifier circuit and the bias circuit. The capacitive element is connected to the wiring so as to cancel at least part of parasitic inductance produced in the wiring. The amplifier circuit includes an input terminal, an amplifier, a first capacitor, a connection node, and first and second resistors. An input signal is inputted into the input terminal. The amplifier amplifies the input signal. The first capacitor is disposed on a path which connects the input terminal and the amplifier. The connection node disposed between the capacitive element and the amplifier. The first resistor is disposed on a path which connects the input terminal and the connection node. The second resistor is connected between the amplifier and the connection node.

In such a distortion compensation circuit, the effect of decreasing the distortion by the first resistor may be expected. On the other hand, however, parasitic inductance produced in the wiring may lessen this effect. The influence of the parasitic inductance is noticeable particularly when the wiring is long. In the distortion compensation circuit according to an embodiment of the disclosure, however, the capacitive element cancels at least part of the parasitic inductance produced in the wiring. The effect of decreasing the distortion by the first resistor is thus less likely to be lessened by the parasitic inductance. It is thus possible to provide a distortion compensation circuit that exhibits high distortion characteristics even with the use of a long wiring.

In the above-described distortion compensation circuit, the capacitive element may include a second capacitor and a third resistor. The second capacitor is connected in series with the wiring. The third resistor is connected in parallel with the second capacitor.

This configuration enhances the effect of canceling the parasitic inductance more precisely than when the second capacitor is disposed on a path connecting the wiring and a ground (that is, when the second capacitor is connected to the wiring by shunt connection).

In the above-described distortion compensation circuit, the capacitive element may include a second capacitor that is disposed on a path which connects the wiring and a ground.

In this configuration, the capacitive element is constituted only by the second capacitor, thereby simplifying the configuration of the capacitive element.

The above-described distortion compensation circuit may further include first and second chips different from each other. The first chip includes the amplifier circuit. The second chip includes the bias circuit.

The distortion compensation circuit includes the first and second chips. In this case, different substrates may be used for the first chip and the second chip. That is, the material of a substrate used for the first chip and that for the second chip may be different from each other. This makes it possible to form the amplifier circuit on a substrate made of a material optimal for the amplifier circuit and also to form the bias circuit on a substrate made of a material optimal for the bias circuit. In the distortion compensation circuit, the amplifier circuit and the bias circuit are included in different chips. In this case, a longer wiring may be required to connect the first and second chips than when the amplifier circuit and the bias circuit are included in the same chip. The parasitic inductance in the wiring may accordingly be increased. In the above-described distortion compensation circuit, however, the capacitive element cancels at least part of the parasitic inductance produced in the wiring. The effect of decreasing the distortion by the first resistor is thus less likely to be lessened by the parasitic inductance.

In the above-described distortion compensation circuit, the capacitive element may be included in at least one of the first and second chips.

The capacitive element is included in the first chip or the second chip. This can save the space for disposing the capacitive element and reduce the cost for forming the capacitive element, in comparison with when the capacitive element is included neither in the first chip nor the second chip.

In the above-described distortion compensation circuit, the capacitive element may be included in the first chip.

Typically, the first chip including the amplifier circuit is formed by a process with higher dimensional accuracy than the second chip including the bias circuit. Forming the capacitive element in the first chip can thus enhance the precision characteristics of the capacitive element. That is, the capacitive element is able to cancel the parasitic inductance with higher precision.

In the above-described distortion compensation circuit, the first chip may include a GaAs substrate, and the second chip may include a Si substrate.

The first chip includes a GaAs substrate, so that the amplifier included in the first chip can be formed of a GaAs material. This makes it possible to decrease the distortion of the amplifier. The second chip includes a Si substrate. Using a Si substrate for the second chip can reduce the cost, in comparison with when a GaAs substrate is used for both of the first and second chips.

According to an aspect of the present disclosure, it is possible to provide a distortion compensation circuit which exhibits high distortion characteristics even with the use of a long wiring between a bias circuit and an amplifier circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
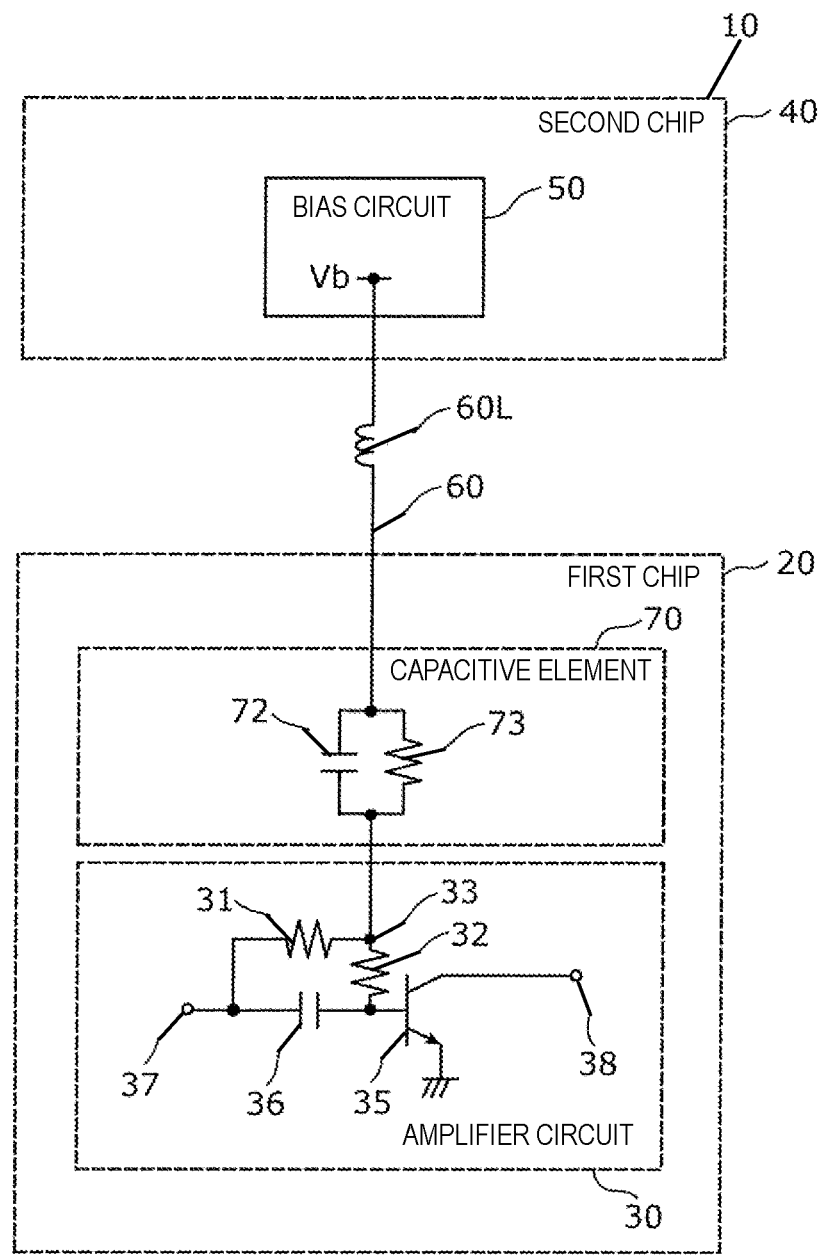
FIG. 1 is a schematic circuit diagram illustrating the configuration of a distortion compensation circuit according to a first embodiment.

Embodiments of the present disclosure will be described below in detail with reference to the accompanying drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios. In the drawings, substantially the same components are designated by like reference numeral, and an explanation of such components will not be repeated or be merely simplified.

First Embodiment

[1-1. Configuration]

The configuration of a distortion compensation circuit 10 according to a first embodiment will be described below with reference to FIG. 1. FIG. 1 is a schematic circuit diagram illustrating the configuration of the distortion compensation circuit 10 according to the first embodiment. As shown in FIG. 1, the distortion compensation circuit 10 includes an amplifier circuit 30, a bias circuit 50, a wiring 60, and a capacitive element 70. In the first embodiment, the distortion compensation circuit 10 includes a first chip 20 and a second chip 40. The first chip 20 includes the amplifier circuit 30. The second chip 40, which is different from the first chip 20, includes the bias circuit 50.

The amplifier circuit 30 amplifies an input signal. In the first embodiment, the amplifier circuit 30 is a power amplifier which amplifies a 5-GHz radio-frequency (RF) signal, for example. The amplifier circuit 30 includes an input terminal 37, an output terminal 38, an amplifier 35, a first capacitor 36, a connection node 33, and first and second resistors 31 and 32.

An input signal is inputted into the input terminal 37. An input signal is amplified by the amplifier 35 and is outputted from the output terminal 38. In the first embodiment, the output terminal 38 is connected to the collector terminal of the amplifier 35, which is constituted by a bipolar transistor. The connection node 33 is disposed between the capacitive element and the amplifier, and directly or indirectly connected to the wiring 60.

The amplifier 35 is an element which amplifies an input signal. In the first embodiment, the amplifier 35 is a bipolar transistor. In the amplifier 35, the first capacitor 36 and the second resistor 32 are connected to the base terminal, the output terminal 38 is connected to the collector terminal, and the emitter terminal is grounded. Another element, such as a resistor, may be inserted between the emitter terminal of the amplifier 35 and a ground. A collector voltage is applied to the collector terminal of the amplifier 35, though it is not shown. The collector voltage is suitably set in accordance with the characteristics of the amplifier 35. In the first embodiment, the collector voltage is about 3.3 V.

The first capacitor 36 is an element disposed on a path which connects the input terminal 37 and the amplifier 35. In the first embodiment, one electrode of the first capacitor 36 is connected to the input terminal 37, while the other electrode is connected to the base terminal of the amplifier 35. The first capacitor 36 serves as a high pass filter for an input signal. That is, the first capacitor 36 blocks low-frequency components of the input signal and allows high-frequency components thereof to pass therethrough. The capacitance of the first capacitor 36 is suitably set in accordance with the frequency characteristics of an input signal and those required for an output signal. In the first embodiment, the capacitance of the first capacitor 36 is about 1.3 pF.

The first resistor 31 is a resistor for improving the distortion characteristics of the distortion compensation circuit 10. The first resistor 31 is disposed on a path which connects the input terminal 37 and the connection node 33. By connecting the first resistor 31 in this manner, a part of the input signal inputted into the input terminal 37 flows into the connection node 33 so as to raise the voltage of the connection node 33. This can increase the bias (current) of the amplifier 35, thereby improving the distortion characteristics of the distortion compensation circuit 10. The resistance of the first resistor 31 is suitably set in accordance with the characteristics of the amplifier 35 and the input signal. In the first embodiment, the resistance of the first resistor 31 is about 50Ω.

The second resistor 32 is a resistor for dividing a bias voltage and is connected between the amplifier 35 and the connection node 33. In the first embodiment, one terminal of the second resistor 32 is connected to the base terminal of the amplifier 35, while the other terminal is connected to the connection node 33. When an overcurrent flows from the bias circuit 50 into the amplifier 35, a voltage drop is generated across the second resistor 32 in accordance with the overcurrent, thereby making thermal runaway less likely to occur in the amplifier 35. The resistance of the second resistor 32 is suitably set in accordance with the characteristics of the amplifier 35, for example. In the first embodiment, the resistance of the second resistor 32 is about 900Ω. The resistance of the second resistor 32 is higher than that of the first resistor 31.

The bias circuit 50 applies a bias voltage Vb to the amplifier circuit 30. The value of the bias voltage Vb is suitably set in accordance with the characteristics of the amplifier circuit 30 and the input signal.

The wiring 60 is a conductive line which connects the amplifier circuit 30 and the bias circuit 50. The wiring 60 may be a wire or a wiring pattern formed on a substrate, for example. In the first embodiment, the wiring 60 includes a wire which electrically connects the first chip 20 and the second chip 40. Connecting the amplifier circuit 30 and the bias circuit 50 by the wiring 60 includes, not only the configuration in which the wiring 60 is directly connected to the amplifier circuit 30 and the bias circuit 50, but also the configuration in which the wiring 60 is indirectly connected to the amplifier circuit 30 and the bias circuit 50 via another element. In the first embodiment, the wiring 60 is directly connected to the bias circuit 50 and is indirectly connected to the amplifier circuit 30 via the capacitive element 70. In the wiring 60, a parasitic inductance 60L is produced.

The capacitive element 70 is connected to the wiring 60 so as to cancel at least part of the parasitic inductance 60L produced in the wiring 60. In this case, the capacitive element 70 may be connected in series with or in parallel with the wiring 60. Alternatively, the capacitive element 70 may be connected to a certain portion of the wiring 60. For example, the capacitive element 70 may be inserted into a portion somewhere in the wiring 60, or one terminal of the capacitive element 70 may be connected to a portion of the wiring 60 other than the end portions, while the other terminal of the capacitive element 70 may be connected to a ground. The capacitive element 70 may be constituted by a single element or plural elements. In the first embodiment, the capacitive element 70 includes a second capacitor 72 connected in series with the wiring 60 and a third resistor 73 connected in parallel with the second capacitor 72. The characteristics of the capacitive element 70 are not restricted to particular characteristics if they are able to cancel at least part of the parasitic inductance 60L produced in the wiring 60. Canceling at least part of the parasitic inductance 60L produced in the wiring 60 means decreasing the inductance of the composite circuit of the wiring 60 and the capacitive element 70 by the amount of parasitic inductance 60L produced in the wiring 60.

The first chip 20 is an electronic component including the amplifier circuit 30. In the first embodiment, the first chip 20 is an integrated circuit including the amplifier circuit 30 and the capacitive element 70.

The second chip 40 is an electronic component including the bias circuit 50. In the first embodiment, the second chip 40 is an integrated circuit including the bias circuit 50.

The distortion compensation circuit 10 includes the first chip 20 and the second chip 40. In this case, different substrates may be used for the first chip 20 and the second chip 40. That is, the material used for the first chip 20 and that for the second chip 40 may be different from each other. This makes it possible to form the amplifier circuit 30 on a substrate made of a material optimal for the amplifier circuit 30 and also to form the bias circuit 50 on a substrate made of a material optimal for the bias circuit 50. In the first embodiment, the first chip 20 includes a GaAs substrate, and the amplifier circuit 30 including a bipolar transistor and the capacitive element 70 are formed on the GaAs substrate. Including the GaAs substrate in the first chip 20 makes it possible to form the amplifier 35 in the first chip 20 of a GaAs material, thereby decreasing the distortion of the amplifier 35. The second chip 40 includes a Si substrate, and the bias circuit 50 is formed on the Si substrate. Using a Si substrate for the second chip 40 can reduce the cost, in comparison with when a GaAs substrate is used for both of the first chip 20 and the second chip 40. The bias circuit 50 may be formed on a silicon-on-insulator (SOI) substrate including a silicon oxide ($SiO_2$) film, for example, on a Si substrate. In this case, too, the second chip 40 includes a Si substrate, thereby reducing the cost for forming the second chip 40.

[1-2. Advantages]

Advantages of the distortion compensation circuit 10 according to the first embodiment will be discussed below.

As described above, the distortion compensation circuit 10 according to the first embodiment includes the wiring 60 and the capacitive element 70. The wiring 60 connects the amplifier circuit 30 and the bias circuit 50. The capacitive element 70 is connected to the wiring 60 so as to cancel at least part of the parasitic inductance 60L produced in the wiring 60. The amplifier circuit 30 includes the input terminal 37, the amplifier 35, the first capacitor 36, the connection node 33, and the first and second resistors 31 and 32. An input signal is inputted into the input terminal 37. The amplifier 35 amplifies the input signal. The first capacitor 36 is disposed on a path which connects the input terminal 37 and the amplifier 35. The connection node 33 is directly or indirectly connected to the wiring 60. The first resistor 31 is disposed on a path which connects the input terminal 37 and the connection node 33. The second resistor 32 is connected between the amplifier 35 and the connection node 33.

In the distortion compensation circuit 10, the effect of decreasing the distortion by the first resistor 31 may be expected. On the other hand, however, the parasitic inductance 60L produced in the wiring 60 may lessen this effect. The influence of the parasitic inductance 60L is noticeable particularly when the wiring 60 is long. In the distortion compensation circuit 10 of the first embodiment, the amplifier circuit 30 is included in the first chip 20, while the bias circuit 50 is included in the second chip 40, which is different from the first chip 20. In this case, a longer wiring 60 may be required to connect the first and second chips 20 and 40 than when the amplifier circuit 30 and the bias circuit 50 are included in the same chip. The parasitic inductance 60L in the wiring 60 may accordingly be increased. In the distortion compensation circuit 10 of the first embodiment, however, the capacitive element 70 cancels at least part of the parasitic inductance 60L produced in the wiring 60. The effect of decreasing the distortion by the first resistor 31 is thus less likely to be lessened by the parasitic inductance 60L. It is thus possible to implement a distortion compensation circuit which exhibits high distortion characteristics even with the use of a long wiring.

In the distortion compensation circuit 10 of the first embodiment, the capacitive element 70 includes the second capacitor 72 connected in series with the wiring 60 and the third resistor 73 connected in parallel with the second capacitor 72. This enhances the effect of canceling the parasitic inductance 60L than when the second capacitor 72 is disposed on a path connecting a node on the wiring 60 and a ground (that is, when the second capacitor 72 is connected to the wiring 60 by shunt connection).

In the distortion compensation circuit 10 of the first embodiment, the capacitive element 70 is included in the first chip 20. This can save the space for disposing the capacitive element 70 and reduce the cost for forming the capacitive element 70, in comparison with when the capacitive element 70 is included neither in the first chip 20 nor the second chip 40. If the capacitive element 70 is disposed outside the first and second chips 20 and 40, another element, such as a substrate, for forming or mounting the capacitive element 70 thereon is required. If the capacitive element 70 is formed in the first chip 20 or the second chip 40, it can be formed by the same process as that for another element, such as the amplifier circuit 30, thereby reducing the time and cost for forming the capacitive element 70. Typically, the first chip 20 including the amplifier circuit 30 is formed by a process with higher dimensional accuracy than the second chip 40 including the bias circuit 50. Forming the capacitive element 70 in the first chip 20 can thus enhance the precision characteristics of the capacitive element 70. That is, the capacitive element 70 is able to cancel the parasitic inductance 60L with higher precision.

Second Embodiment

A distortion compensation circuit 110 according to a second embodiment will be described below. The configuration of the distortion compensation circuit 110 is similar to that of the distortion compensation circuit 10 of the first embodiment, except for the position of the capacitive element 70. The distortion compensation circuit 110 of the second embodiment will now be discussed below with reference to FIG. 2 mainly by referring to points different from the distortion compensation circuit 10 of the first embodiment.

Figure 2:
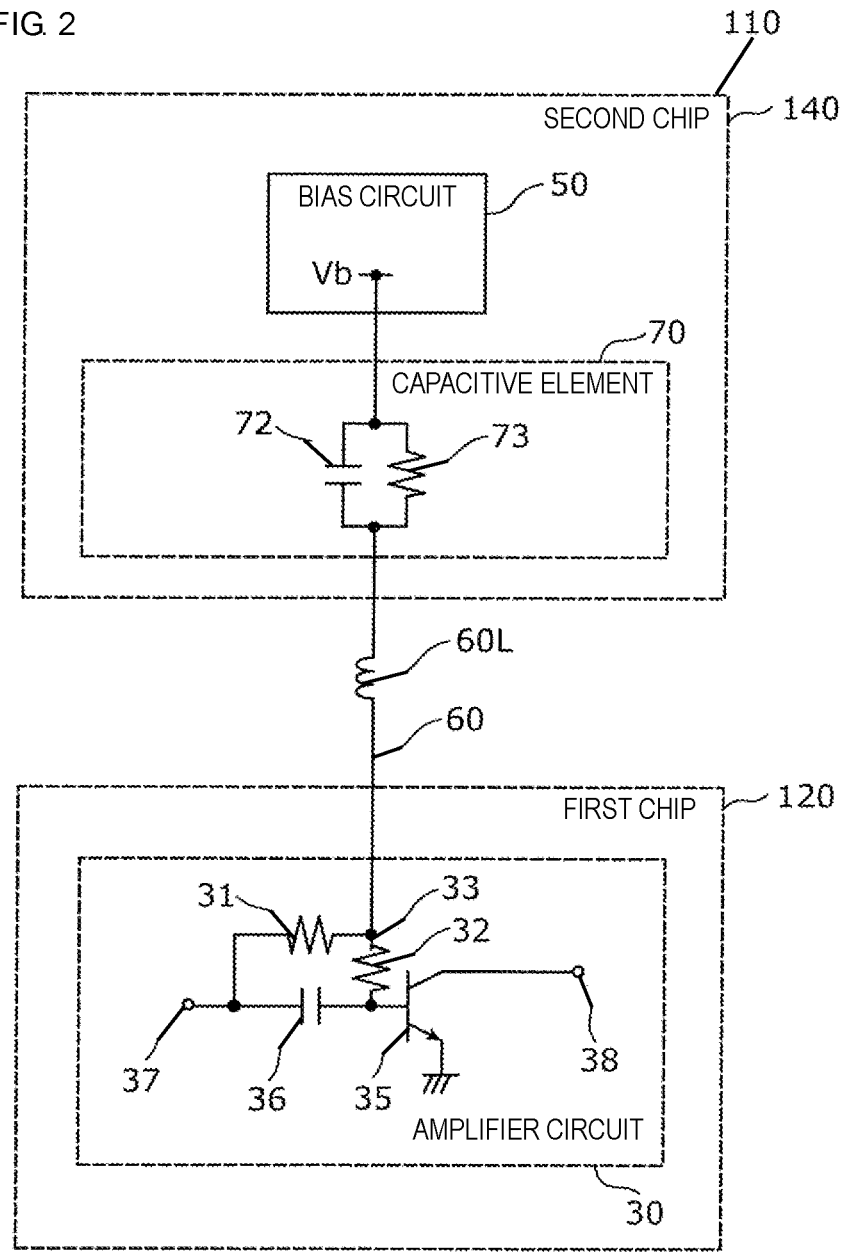
FIG. 2 is a schematic circuit diagram illustrating the configuration of a distortion compensation circuit according to a second embodiment.

FIG. 2 is a schematic circuit diagram illustrating the configuration of the distortion compensation circuit 110 according to the second embodiment. As shown in FIG. 2, the distortion compensation circuit 110 includes an amplifier circuit 30, a bias circuit 50, a wiring 60, and a capacitive element 70. In the second embodiment, the amplifier circuit 30 is included in a first chip 120, while the bias circuit 50 and the capacitive element 70 are included in a second chip 140.

As in the first embodiment, the distortion compensation circuit 110 of the second embodiment includes the wiring 60 which connects the amplifier circuit 30 and the bias circuit 50, and also includes the capacitive element 70 which is connected to the wiring 60 so as to cancel at least part of the parasitic inductance 60L produced in the wiring 60. The provision of the capacitive element 70 can make the parasitic inductance 60L less likely to lessen the effect of decreasing the distortion by the first resistor 31.

In the second embodiment, the capacitive element 70 is included in the second chip 140. This can save the space for disposing the capacitive element 70 and reduce the cost for forming the capacitive element 70, in comparison with when the capacitive element 70 is included neither in the first chip 20 nor the second chip 40.

Third Embodiment

A distortion compensation circuit 210 according to a third embodiment will be described below. The configuration of the distortion compensation circuit 210 is similar to that of the distortion compensation circuit 10 of the first embodiment, except for the configuration of a capacitive element 270. The distortion compensation circuit 210 of the third embodiment will now be discussed below with reference to FIG. 3 mainly by referring to points different from the distortion compensation circuit 10 of the first embodiment.

Figure 3:
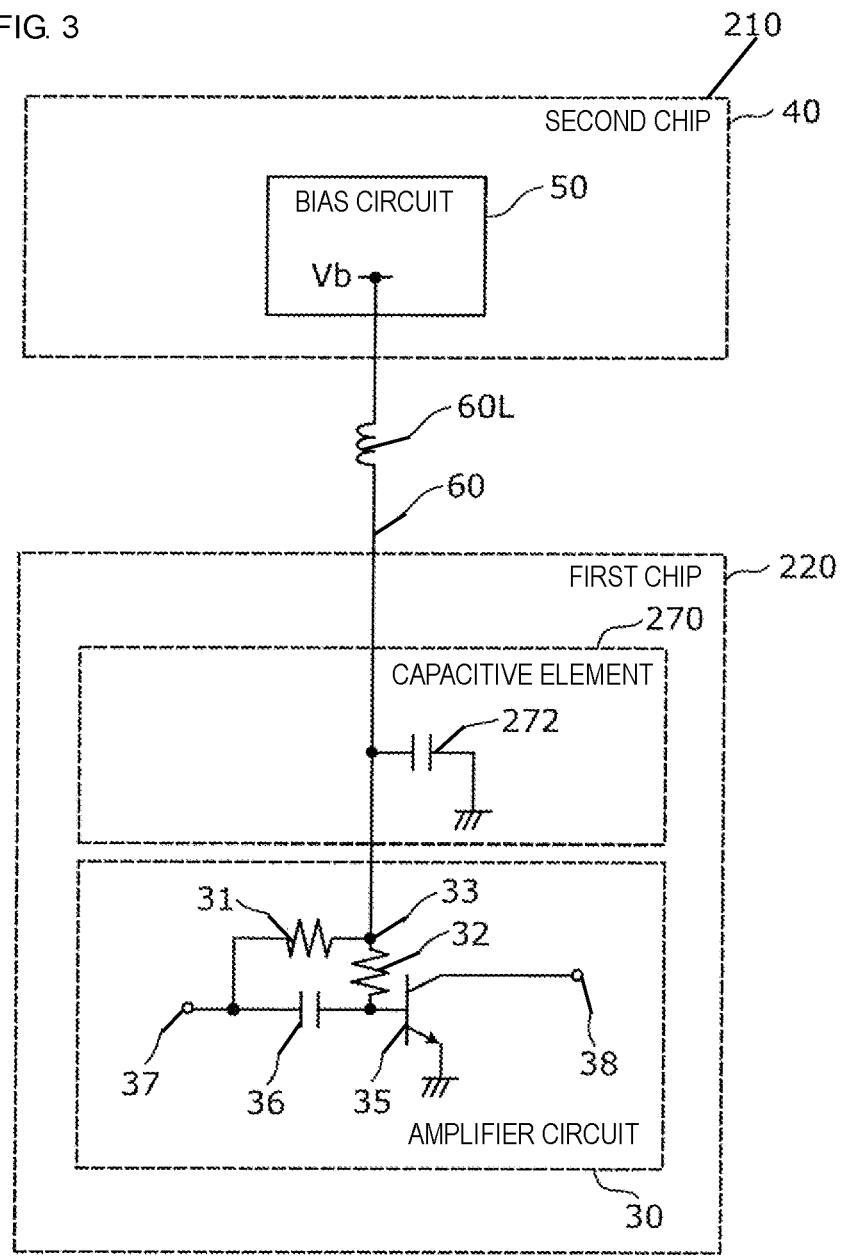
FIG. 3 is a schematic circuit diagram illustrating the configuration of a distortion compensation circuit according to a third embodiment.

FIG. 3 is a schematic circuit diagram illustrating the configuration of the distortion compensation circuit 210 according to the third embodiment. As shown in FIG. 3, the distortion compensation circuit 210 includes an amplifier circuit 30, a bias circuit 50, a wiring 60, and a capacitive element 270. In the third embodiment, the amplifier circuit 30 and the capacitive element 270 are included in a first chip 220, while the bias circuit 50 is included in a second chip 40.

As in the first embodiment, the distortion compensation circuit 210 of the third embodiment includes the wiring 60 which connects the amplifier circuit 30 and the bias circuit 50, and also includes the capacitive element 270 which is connected to the wiring 60 so as to cancel at least part of the parasitic inductance 60L produced in the wiring 60. The provision of the capacitive element 270 can make the parasitic inductance 60L less likely to lessen the effect of decreasing the distortion by the first resistor 31.

The capacitive element 270 includes a second capacitor 272 which is connected to the wiring 60 by shunt connection. The second capacitor 272 is disposed on a path connecting a node on the wiring 60 and a ground. In the third embodiment, one electrode of the second capacitor 272 is connected to a node on the wiring 60, while the other electrode is connected to a ground. As in the distortion compensation circuits 1 and 110, by using the capacitive element 270 configured as described above, it is possible to make the parasitic inductance 60L less likely to lessen the effect of decreasing the distortion by the first resistor 31. In the third embodiment, the capacitive element 270 is constituted only by the second capacitor 272, thereby simplifying the configuration of the capacitive element 270.

Fourth Embodiment

A distortion compensation circuit 310 according to a fourth embodiment will be described below. The configuration of the distortion compensation circuit 310 is similar to that of the distortion compensation circuit 10 of the first embodiment, except for the configuration of an amplifier circuit 330. The distortion compensation circuit 310 of the fourth embodiment will now be discussed below with reference to FIG. 4 mainly by referring to points different from the distortion compensation circuit 10 of the first embodiment.

Figure 4:
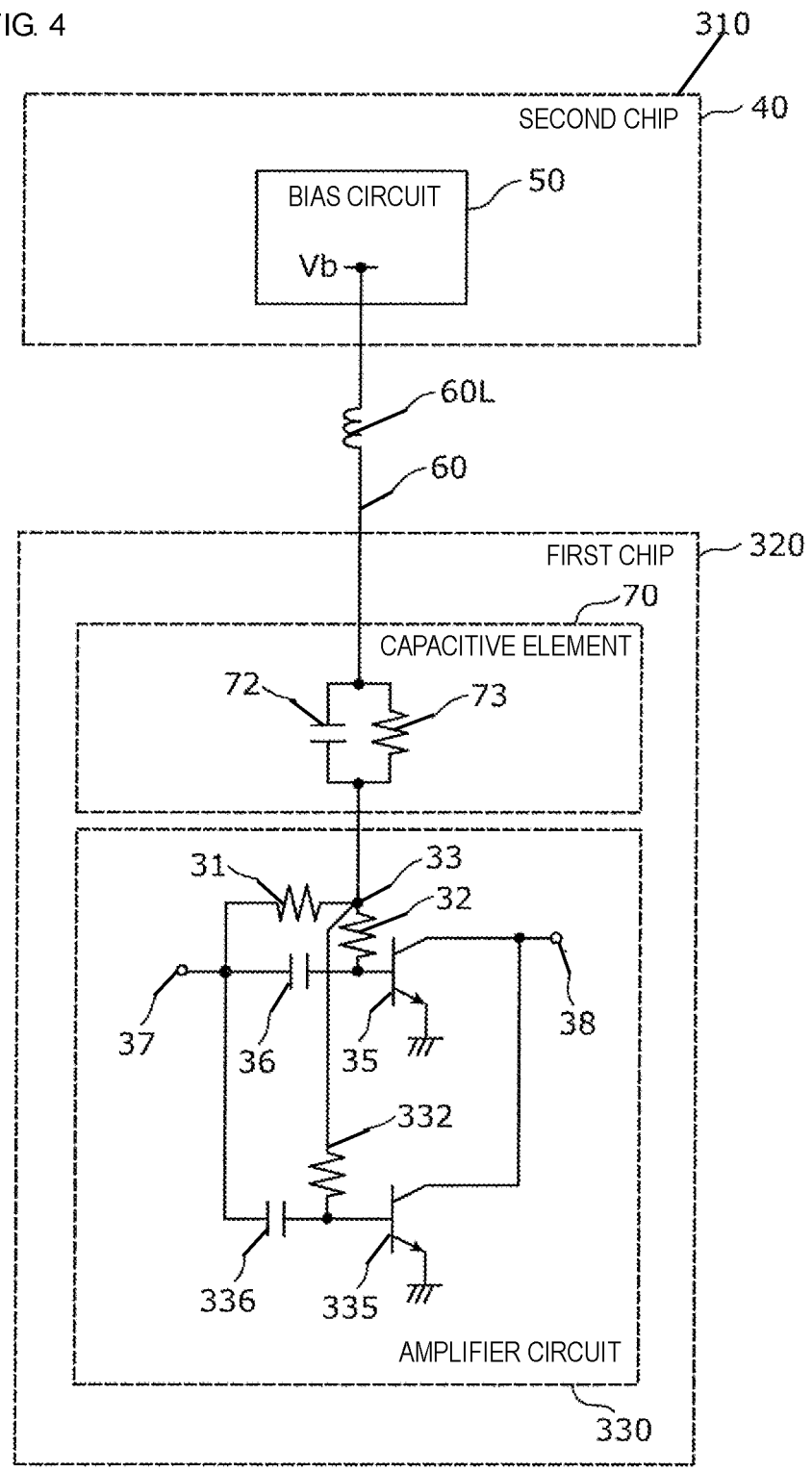
FIG. 4 is a schematic circuit diagram illustrating the configuration of a distortion compensation circuit according to a fourth embodiment.

FIG. 4 is a schematic circuit diagram illustrating the configuration of the distortion compensation circuit 310 according to the fourth embodiment. As shown in FIG. 4, the distortion compensation circuit 310 includes an amplifier circuit 330, a bias circuit 50, a wiring 60, and a capacitive element 70. In the fourth embodiment, the amplifier circuit 330 and the capacitive element 70 are included in a first chip 320, while the bias circuit 50 is included in a second chip 40.

The amplifier circuit 330 is different from the amplifier circuit 30 of the first embodiment in that it includes two amplifiers. That is, the amplifier circuit 330 includes an amplifier 335 in addition to the amplifier 35. The amplifier circuit 330 also includes two first capacitors 36 and 336 and two second resistors 32 and 332.

As in the amplifier 35, the amplifier 335 is an element for amplifying an input signal. In the fourth embodiment, the amplifier 335 is a bipolar transistor. In the amplifier 335, the first capacitor 336 and the second resistor 332 are connected to the base terminal, an output terminal 38 is connected to the collector terminal, and the emitter terminal is connected to a ground. A collector voltage is applied to the collector terminal of the amplifier 335, though it is not shown.

The first capacitor 336 is an element disposed on a path which connects the input terminal 37 and the amplifier 335. In the fourth embodiment, one electrode of the first capacitor 336 is connected to the input terminal 37, while the other electrode is connected to the base terminal of the amplifier 335. The first capacitor 336 serves as a high pass filter for an input signal, as in the first capacitor 36.

The second resistor 332 is a resistor for dividing a bias voltage, as in the second resistor 32, and is connected between the amplifier 335 and the connection node 33. In the fourth embodiment, one terminal of the second resistor 332 is connected to the base terminal of the amplifier 335, while the other terminal is connected to the connection node 33.

In the distortion compensation circuit 310 as well as in the distortion compensation circuits, 1, 110, and 210 of the first through third embodiments, it is possible to make the parasitic inductance 60L less likely to lessen the effect of decreasing the distortion by the first resistor 31. As discussed above, the amplifier circuit 330 amplifies an input signal by using the two amplifiers 35 and 335. This can increase the gain in the amplifier circuit 330. Although in the fourth embodiment the amplifier circuit 330 includes two amplifiers, it may include three or more amplifiers. In this case, the amplifier circuit 330 includes as many first capacitors and as many second resistors as amplifiers.

Other Embodiments

The distortion compensation circuits according to embodiments of the disclosure have been discussed through illustration of the first through fourth embodiments. However, the disclosure is not restricted to the above-described embodiments. Certain elements in the above-described embodiments may be combined to realize other embodiments, and various modifications apparent to those skilled in the art may be made to the embodiments without departing from the scope and spirit of the disclosure. Such embodiments and modified examples are also encompassed within the disclosure. Additionally, various apparatuses integrating a distortion compensation circuit of an embodiment of the disclosure therein are also encompassed within the disclosure.

For example, the distortion compensation circuits of the above-described embodiments each include the first chip having the amplifier circuit and the second chip having the bias circuit. However, the distortion compensation circuits are not limited to this configuration. For example, the distortion compensation circuits may include only one chip on which the amplifier circuit and the bias circuit are disposed. In this case, the capacitive element may also be included in the chip.

Although the capacitive element is included only in one of the first and second chips in the above-described embodiments, it may be included in each of the first and second chips. The capacitive element may be configured in any manner if it is able to cancel at least part of the parasitic inductance 60L. For example, the capacitive element may be configured as a combination of the capacitive element 70 of the first embodiment and the capacitive element 270 of the third embodiment.

Although the first capacitor 36 or 336 is singly used to form a high pass filter in the above-described embodiments, the high pass filter may be configured in a different manner. For example, an RC parallel circuit of a capacitor and a resistor connected in parallel with each other may be used as a high pass filter.

In all the embodiments, the amplifiers are bipolar transistors. However, the amplifiers may be another type of transistor, such as a field-effect transistor (FET).

In the above-described embodiments, the first chip includes a GaAs substrate, while the second chip includes a Si substrate. However, both of the first and second chips may include a Si substrate. This makes it possible to further reduce the cost, in comparison with when one of the first and second chips includes a GaAs substrate. Conversely, both of the first and second chips may include a GaAs substrate. In this case, in addition to the characteristics of the amplifier circuit included in the first chip, the characteristics of the bias circuit included in the second chip are also less likely to be degraded.

A distortion compensation circuit according to an embodiment of the disclosure, which exhibits high distortion characteristics, may be used in a communication device, such as a smartphone and a tablet terminal.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A distortion compensation circuit comprising:
   an amplifier circuit;
   a bias circuit configured to supply a bias voltage to the amplifier circuit;
   wiring that connects the amplifier circuit and the bias circuit; and
   a capacitive element that is connected to the wiring and that is configured to cancel at least part of a parasitic inductance produced in the wiring,
   wherein the amplifier circuit comprises:
      an input terminal into which an input signal is input,
      an amplifier configured to amplify the input signal,
      a connection node between the capacitive element and the amplifier,
      a first capacitor that is disposed on a path that connects the input terminal and the amplifier,
      a first resistor that is disposed on a path that connects the input terminal and the connection node, and
      a second resistor that is disposed on a path that connects the amplifier and the connection node.

2. The distortion compensation circuit according to claim 1, wherein the capacitive element comprises:
   a second capacitor that is connected in series with the wiring, and
   a third resistor that is connected in parallel with the second capacitor.

3. The distortion compensation circuit according to claim 1, wherein the capacitive element comprises:
   a second capacitor that is disposed on a path that connects the wiring and ground.

4. The distortion compensation circuit according to claim 1, wherein:
   the amplifier circuit is provided in or on a first chip,
   the bias circuit is provided in or on a second chip, and
   the first chip is different than the second chip.

5. The distortion compensation circuit according to claim 2, wherein:
   the amplifier circuit is provided in or on a first chip,
   the bias circuit is provided in or on a second chip, and
   the first chip is different than the second chip.

6. The distortion compensation circuit according to claim 3, wherein:
   the amplifier circuit is provided in or on a first chip,
   the bias circuit is provided in or on a second chip, and
   the first chip is different than the second chip.

7. The distortion compensation circuit according to claim 4, wherein the capacitive element is provided in or on the first chip.

8. The distortion compensation circuit according to claim 5, wherein the capacitive element is provided in or on the first chip.

9. The distortion compensation circuit according to claim 6, wherein the capacitive element is provided in or on the first chip.

10. The distortion compensation circuit according to claim 4, wherein the capacitive element is provided in or on the second chip.

11. The distortion compensation circuit according to claim 5, wherein the capacitive element is provided in or on the second chip.

12. The distortion compensation circuit according to claim 6, wherein the capacitive element is provided in or on the second chip.

13. The distortion compensation circuit according to claim 4, wherein:

the first chip includes a gallium arsenide (GaAs) substrate; and the second chip includes a silicon (Si) substrate.

14. The distortion compensation circuit according to claim 5, wherein:

the first chip includes a gallium arsenide (GaAs) substrate; and the second chip includes a silicon (Si) substrate.

15. The distortion compensation circuit according to claim 6, wherein:

the first chip includes a gallium arsenide (GaAs) substrate; and the second chip includes a silicon (Si) substrate.

16. The distortion compensation circuit according to claim 1, wherein a resistance value of the second resistor is greater than a resistance value of the first resistor.

* * * * *